United States Patent
Shimomura et al.

[11] Patent Number: 5,935,322
[45] Date of Patent: Aug. 10, 1999

[54] METHOD OF PULLING UP A SINGLE CRYSTAL SEMICONDUCTOR

[75] Inventors: Koichi Shimomura; Yoshinobu Hiraishi; Mitsunori Kawabata; Kentaro Nakamura, all of Kanagawa, Japan

[73] Assignee: Komatsu Electronic Metals Co., Ltd., Kanagawa, Japan

[21] Appl. No.: 09/060,161

[22] Filed: Apr. 15, 1998

[30] Foreign Application Priority Data

Apr. 15, 1997 [JP] Japan .................................... 9-097002

[51] Int. Cl.⁶ .................................................. C30B 15/26
[52] U.S. Cl. ................................ 117/14; 117/15; 117/201
[58] Field of Search .............................. 117/14, 150, 200, 117/201, 202

[56] References Cited

U.S. PATENT DOCUMENTS

| | | | |
|---|---|---|---|
| 5,170,061 | 12/1992 | Baba | 117/14 |
| 5,240,684 | 8/1993 | Baba et al. | 117/14 |
| 5,437,242 | 8/1995 | Hofstetter et al. | 117/14 |
| 5,653,799 | 8/1997 | Fuerhoff | 117/14 |
| 5,665,159 | 9/1997 | Fuerhoff | 117/14 |
| 5,746,825 | 5/1998 | Von Ammon et al. | 117/14 |

*Primary Examiner*—Felisa Hiteshew
*Attorney, Agent, or Firm*—Sughrue, Mion, Zinn, Macpeak & Seas, PLLC

[57] ABSTRACT

In the process of forming-the shoulder in which the diameter of a crystal is gradually extended from a small seed crystal to a predetermined value, the largest width of a bright ring, which is formed in a boundary between the melt and the crystal pulled up from the melt, is measured, and an arc width of an arbitrary portion of the bright ring located before the largest width portion is measured. When the largest width of the bright ring has reached a predetermined value, a measured value of the arc width at the arbitrary position of the bright ring is used as a reference value, and after that, automatic control is conducted so that the measured value of the arc width can be close to the reference value.

4 Claims, 4 Drawing Sheets

Lifting Method of this invention

Distribution of the diameter values measured at varions sites

Lifting Method of prior art

Disvibution of the diameter values measured at vorious sites

METHOD OF PULLING UP A SINGLE CRYSTAL SEMICONDUCTOR

BACKGROUND OF THE INVENTION

1. Field of the Invention

The present invention relates to a method for pulling up a single crystal semiconductor such as silicon by the CZ method in which a diameter of the crystal to be pulled up is measured by CCD camera and the thus measured diameter is automatically controlled.

2. Description of the Related Art

When a single crystal is pulled up by the CZ method, there are provided two methods of controlling the diameter of the crystal body. One is an optical method, and the other is a weighting method. In the device for pulling up a single crystal, there is commonly provided a heat shielding plate at an upper position of the melt so that heat of radiation emitted by a heating means such as a graphite heater and also emitted by a surface of the melt can not be transmitted to the crystal body which is being pulled up.

When the crystal is pulled up by the CZ method, there is provided a straight body portion pulling-up process in which the crystal is grown to a columnar shape of a predetermined diameter, and also there is provided a process of forming the shoulder in which the diameter of the crystal is gradually extended from a small seed crystal to the diameter of the straight body portion described above.

According to the optical-type automatic diameter control system, the diameter of the crystal is automatically controlled as follows. A ring-shaped high luminance portion, which is generated on an interface between the crystal body and the melt, this ring-shaped high luminance portion will be referred to as a bright ring hereinafter, is photographed by a television camera. The thus obtained video signal is inputted into an image processing apparatus, so that the width of a portion of the bright ring can be measured. The thus measured value is used as a value representing the diameter of the crystal body, and automatic control is conducted so that the diameter of the crystal body can be made to be close to a target value.

A position at which the width of the bright ring is measured is conventionally determined at a position located before the largest width portion of the bright ring where the width is 60 to 80% of the largest width described before. This measuring position is conventionally fixed at a position by fitting the straight body portion as a reference position.

In the optical diameter control system, the following problems may be encountered. When the process of forming the shoulder and the process of forming the body are continuously controlled, the measurement can not be obtained because the bright ring can not reach the above measurement position.

Further, in the above measurement method, even when a position of the television camera is changed a little, the reproducibility of the position of the crystal and the position of measurement can not be kept, and the measurement value can not be precisely reproduced. For the above reasons, in the actual pulling operation, an operator measures the diameter with a cathetometer, and when an error of large magnitude is found, the operator corrects the target value, so that the diameter of crystal body is near the target value by manually operating.

There is provided a method of measuring the largest width portion of the bright ring in order to measure the diameter of the crystal body. According to this method, the measurement position automatically traces the largest width portion of the bright ring by the function of the image processing apparatus. Therefore, like the aforementioned method in which the measurement value reproducibility is not affected by the measurement position reproducibility, it becomes possible to measure the diameter with high accuracy. Further, even if the diameter is small, the largest width portion can be automatically traced so that the diameter can be measured.

However, in the case of a pulling apparatus having a heat shielding plate, when a bright ring of a growing crystal is photographed by a television camera, a position of the television camera is restricted by the heat shielding plate. Therefore, the television camera is set at a position by an angle of 70 to 80° with respect to the melt surface. When the television camera is set at the position which forms such a large angle with respect to the melt surface, the following problems may be caused. When the crystal body is deformed a little or the diameter of the crystal body is varied in the process of pulling up the straight body portion of the crystal body, the largest width portion is shaded by the crystal body itself, so that the largest width portion can not be seen and also it is true that an actual diameter portion of a column could be seen only by the television camera being set on the axis of the column. Further, a ring-shaped image of high luminance is formed with a lower end portion on the heat shielding plate when light is reflected on the surface of the melt. This ring-shaped image of high luminance is located close to the bright ring. Therefore, it is impossible to discriminate between the ring-shaped image and the bright ring. For the above reasons, the measurement can not be conducted stably.

SUMMARY OF THE INVENTION

The present invention has been accomplished to solve the above problems. It is an object of the present invention to provide a method of pulling up in which the diameter can be stably measured with high accuracy in the process of forming the shoulder and the straight body portion pulling-up process even in the pulling device having a heat shielding plate, so that the diameter of the straight body portion can be automatically controlled and a single crystal, the diameter of which is accurately formed, can be provided.

According to the present invention, in the process of forming the shoulder in which the diameter of a crystal is gradually extended from a small seed crystal to a predetermined value, the largest width of a bright ring, which is formed in a boundary between the melt and the crystal pulled up from the melt, is measured, and an arc width of an arbitrary portion of the bright ring located before the largest width portion is measured. When the largest width of the bright ring has reached a predetermined value, a measured value of the arc width at the arbitrary position of the bright ring is used as a reference value, and after that, automatic control is conducted so that the measured value of the arc width can be close to the reference value.

Due to the foregoing, in the process of forming the shoulder in which the diameter is extended at all times, the largest width of the bright ring is measured with high accuracy of measurement, and in the straight body portion in which a predetermined diameter must be kept, the arc width is measured at a position located before the largest width portion where the arc width is less affected by the change in the diameter or the deformation, and automatic control is conducted so that this value can be constant.

The reason why the above control is conducted is that the luminance of the largest width portion of the bright ring is sufficiently higher than the luminance of a reflected image of the lower end portion of the heat shielding plate in the process of forming the shoulder, so that the largest width portion can be sufficiently discriminated from the reflected image, and the measurement position is sufficiently distant from the reflected image since the arc width before the largest width portion is measured in the straight body portion. Due to the foregoing, it is possible to discriminate between the bright ring and the reflected image on the heat shielding plate. Accordingly, it is possible to conduct measurement stably without being affected by the reflected image.

The process of forming the shoulder can be automatically conducted in such a manner that the target value of the diameter is gradually increased and automatic control is conducted so that the actual diameter can trace this target value. When the actual diameter is obtained by measuring the largest width of the bright ring at this time, it is possible to conduct controlling highly accurately and stably for the above reasons. In the process of forming the body in which the diameter is controlled to be constant, automatic control can be stably conducted when the arc width before the largest width portion is measured.

In the above method, different diameter measuring devices are respectively used in the process of forming the shoulder and the process of forming the body. When the diameter has reached a predetermined value, the control device is changed over and diameter control is conducted.

When the diameter would be automatically, continuously controlled in the process of forming the shoulder and the process of forming the body, it should be necessary to change over the diameter measuring position from the largest width portion of the bright ring, which is the diameter measuring position in the process of forming the shoulder, to the arc width portion, which is the diameter measuring position in the process of forming the body.

When the diameter measuring position is changed over in this way, although the same bright ring is measured, the measured values are varied because the measuring positions are different. When the different measured values are inputted into the automatic control device as they are, the output of control varies greatly. Therefore, it is impossible to conduct controlling stably. Since the size of the arc width portion is smaller than the size of the largest width portion at all times, it is necessary to change the diameter setting value in accordance with that.

According to the present invention, in order to eliminate this change, operation is conducted as follows. Immediately before changing the measuring position, the measured value of the arc width before the largest width portion of the bright ring is subtracted from the measured value of the largest width of the bright ring, and the thus obtained difference is used as a constant. After that, this constant is always added to the measured arc width value. After changing the measuring position, the thus obtained sum When this value is used as a measured value of the diameter, so the above change can be eliminated.

When the measured value of the diameter is inputted into the automatic diameter control device, the measured value of the diameter continuously changes from the process of forming the shoulder to the process of forming the body. Accordingly, it is possible to conduct controlling continuously by one automatic control device.

Further, the method of the present invention is composed as follows. The melt and the crystal, which is being pulled up from the melt, are photographed by a television camera. The largest width portion of the bright ring generated in the boundary between the melt and the crystal body, and the arc portion of the bright ring located before the largest width portion are simultaneously accommodated in the field of view. There is provided a first window in which the image of the television camera is covered with the largest width portion, and also there is provided a second window in which the image of the television camera is covered with the aforementioned portion located before the largest width portion. In each window, the maximum value of the bright ring width is measured by the image processing apparatus.

Due to the foregoing, it is possible to simultaneously measure the width at two positions or more on the same bright ring by one television camera.

As described above, two windows are simultaneously provided on the image obtained by one television camera, and the width of the high luminance portion is measured, which can be accomplished by a common image processing apparatus. Conventionally, measurement is conducted in only one window. However, according to the present invention, measurement is conducted in two windows, so that this function can be effectively utilized.

According to the present invention, the diameter is automatically controlled by the optical method as follows. As a method of measuring the diameter, the bright ring is photographed by the television camera. The largest width and the arc width at a portion located before the largest width portion are simultaneously measured on the image. In the process of forming the shoulder, the measured value of the largest width portion is used, and in the process of forming the body, the arc width before the largest width portion is measured. When this measurement is conducted, two windows are provided on one image, and the largest width of the high luminance portion is measured in these windows. In this way, the largest width and the arc width are measured.

When the process is changed from the process of forming the shoulder to the process of forming the body, at a point of time in which the largest width of the bright ring has reached a predetermined diameter, a constant is calculated so that the sum adding measured value of the arc width to be constant can be the same as the diameter, the sum is used as the value of the diameter. This constant is always used in the process of forming the body so as to calculate the diameter. This operation is conducted by a computer used for controlling the diameter automatically.

BRIEF DESCRIPTION OF THE DRAWINGS

The present invention can be more fully understood by reading the subsequent detailed description and examples with reference made to the accompanying drawings, wherein.

DESCRIPTION OF THE PREFERRED EMBODIMENT

Referring to the accompanying drawings, an example of the present invention will be explained below.

Figure 1:
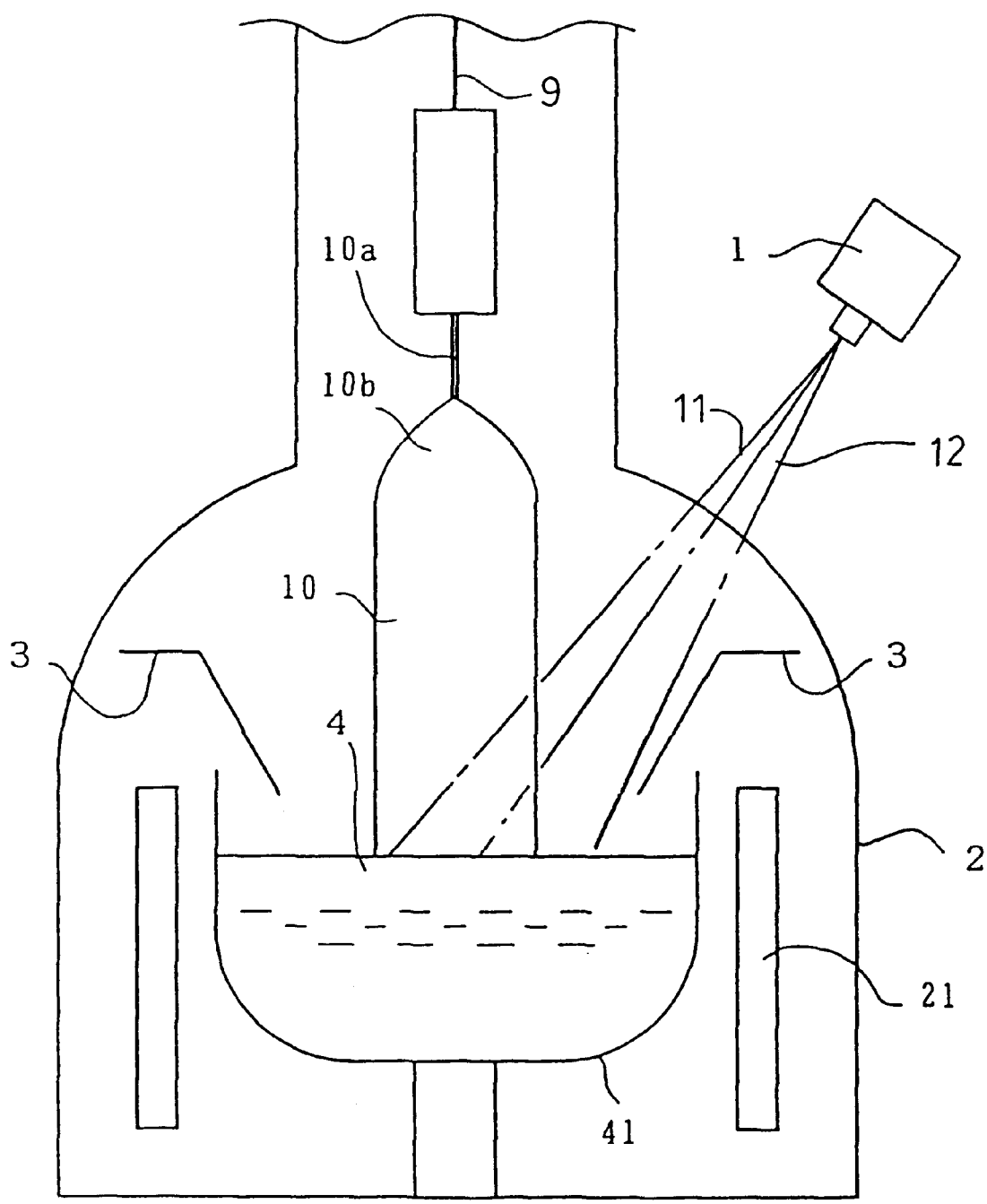
FIG. 1 is a schematic drawing showing an outline structure of the crystal-body-pulling up apparatus according to this invention.
Figure 2:
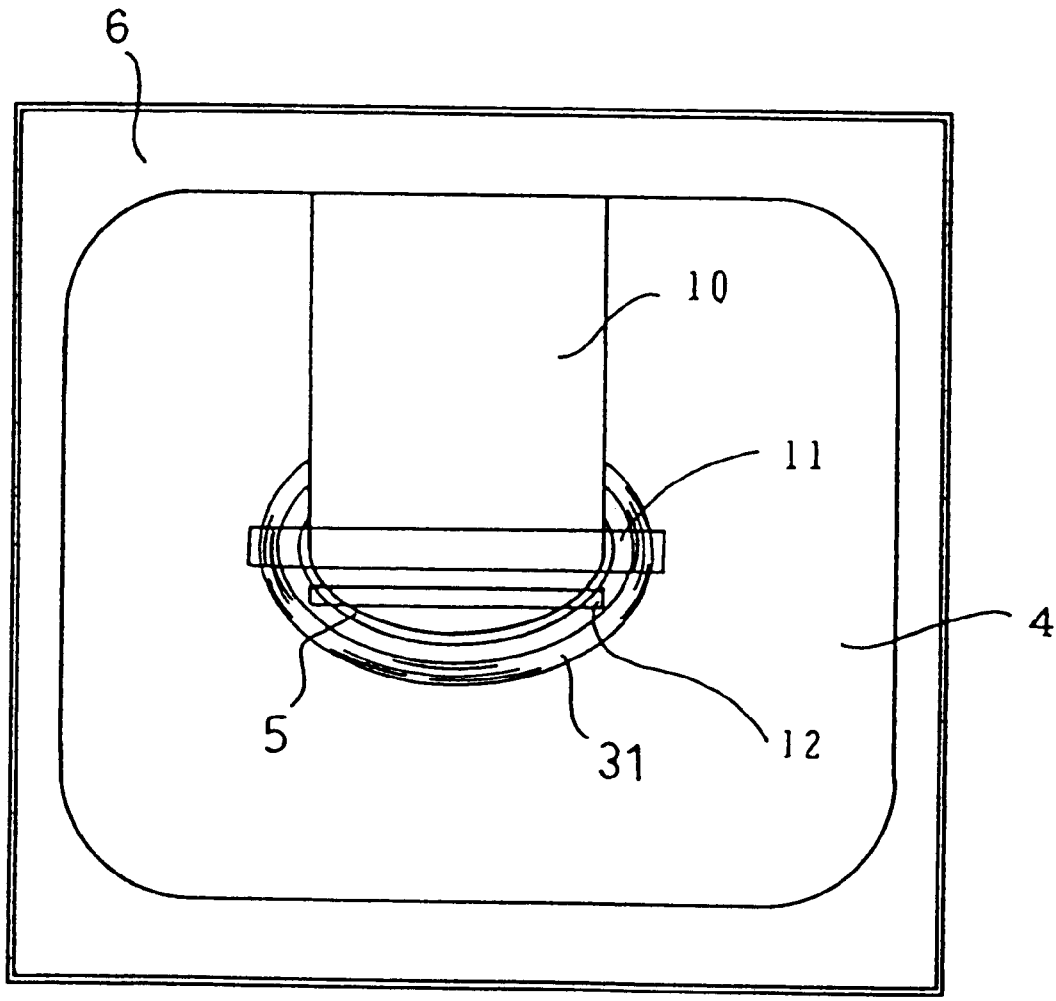
FIG. 2 is a schematic picture shown in a monitor, which is taken by a camera used for controlling the pulling up operation.
Figure 3:
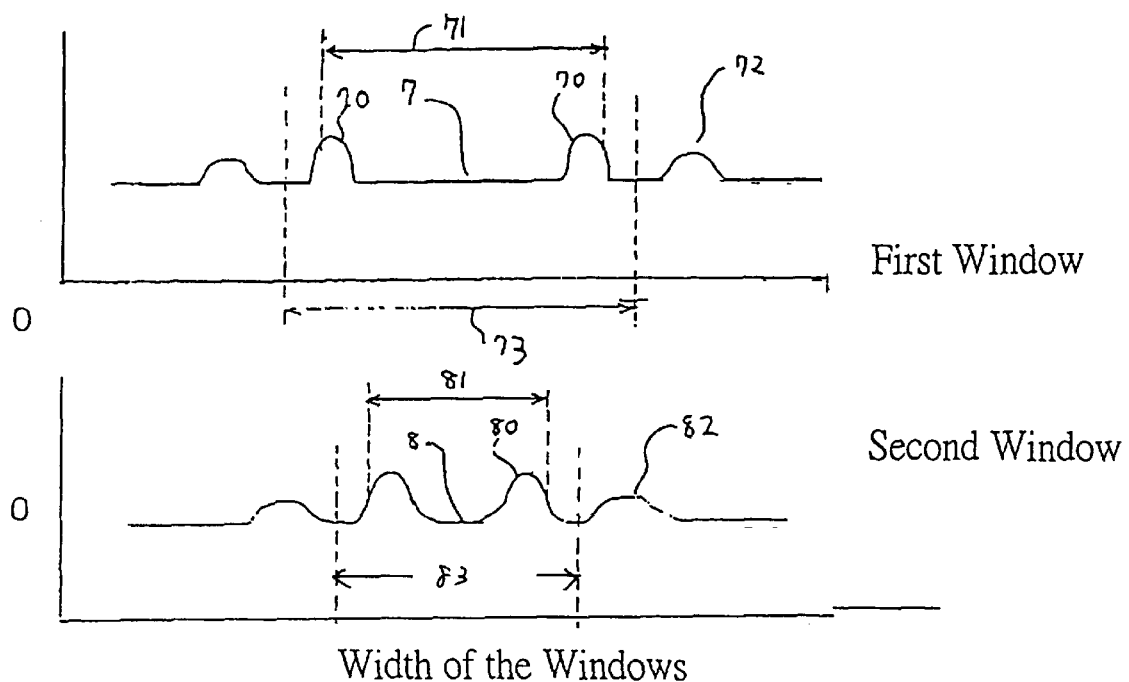
FIG. 3 is a graph showing the method for comparing the respective output data coming from the camera.

FIG. 1 is a schematic illustration showing a model of the pulling device of the present invention. FIG. 2 is a schematic illustration showing a model of an image formed on a monitor, the image being obtained from the pulling device. FIG. 3 is a schematic illustration showing a model of the distribution of luminance on the scanning lines, wherein this view shows a portion of the video signal obtained from the scanning lines composing each window.

As shown in FIG. 1, the pulling device of the present invention includes: a crucible 41; a winding device (not shown in the drawing) for winding up a wire 9 used for suspending a crystal body 10 to be pulled up the crucible 41; a heating means 21 for heating the crucible 41; a heat shielding plate 3 for preventing heat from being transmitted from the heating means 21 and the melt surface 4 to the crystal body 10 which is being pulled up; and a camera 1 for photographing the melt surface 4 in the crucible 41 and the crystal body 10, this camera 1 being arranged in an upper portion of the heat shielding plate 3. Concerning the image photographed by the camera 1, there are provided a first window 11 which covers the largest width portion of the bright ring 5, and a second window 12 which covers an arbitrary portion located before the largest width portion of the bright ring 5. An image photographed by the camera 1 is shown on CRT monitor 6. Width of the high luminance portion in each window is measured by an image processing apparatus not shown in the view. The thus measured value of width is transformed into a voltage proportional to the width, or alternatively the thus measured value of width is transformed into a digital signal expressing the width and then outputted into the diameter control device.

As shown in FIG. 2, on the image photographed by the camera 1, there are shown a melt surface 4 and a crystal body 10 which has been pulled up from the melt. Since this pulling device is provided with a heat shielding plate 3, its reflected image 31 is simultaneously shown outside the outer circumference of the crystal body 10.

Concerning the image photographed by the camera 1, the width of the high luminance portion is measured for each window. These circumstances of measurement are shown in FIG. 3. The distribution of luminance on the scanning lines in the first window is schematically expressed by the reference numeral 7 in FIG. 3. In this distribution of luminance, peaks 70 of luminance of the bright ring 5 are shown inside, and a reflected image 72 of the heat shielding plate 3 is shown outside. The diameter corresponds to an interval 71 of the peaks 70 of luminance. The distribution of luminance on the scanning lines in the second window 12 is schematically shown by the reference numeral 8 in FIG. 3.

Peaks 80 of luminance correspond to the high luminance of the bright ring 5. In the same manner as that described before, an interval 81 of the peaks 80 of luminance corresponds to the arc width.

Reference numerals 73 and 83 respectively show the width of the each window. When the width of the second window is set inside the reflected image, the peak of the reflected image can be located outside the measurement range. In this way, there is no possibility that the peak of the reflected image is mistakenly recognized as a bright ring.

When the diameter of the crystal body is controlled, the pulling speed of the crystal body and electric power fed to the heating means 21 are controlled so that a difference between the measured diameter and the target diameter can be close to zero. When the measured diameter is D, in the process of forming the shoulder, the largest width 71 of the bright ring 5 is set at D, and automatic control is conducted so that the largest width of the bright ring can be close to a predetermined target diameter. Due to the foregoing, the diameter of the actual crystal body is increased in accordance with the target diameter which is gradually increased. When the largest diameter 71 has become a value equivalent to the predetermined diameter of the straight body portion, constant C is calculated by the equation A−B=C, where the largest width 71 is A, and the arc width 81 is B.

A series Dn of the measured diameter D is expressed by the equation $$Dn=Bn+C,$$

where a series of B, which is successively measured, is Bn.

By the above method, the diameter of the straight body portion is controlled to be a constant value, wherein A is set at a target diameter.

Even when the measuring position is changed over, the measured diameter D is not changed. Therefore, the control operation can be stabilized.

Next, a specific method of pulling up a crystal body of this embodiment will be described below.

In the process of forming the shoulder which begins from the seed crystal 10a to the upper portion of the crystal body 10, the diameter of the crystal body is small, and a sufficient clearance is formed between the largest width portion of the bright ring 5 and the reflected image 31 on the heat shield plate 3. Further, luminance of the largest width portion of the bright ring is high so that it can be clearly seen especially in the process of forming the shoulder. Therefore, the largest width portion of the bright ring is seldom affected by the reflected image. Accordingly, the diameter can be stably measured.

When the diameter of the crystal body 10 is gradually increased and the bright ring 5 enters the second window, the measured value of the arc width starts being inputted from the image processing apparatus.

When the measured value of the largest width portion has reached a value equivalent to the predetermined diameter of the straight body portion, constant C is calculated by the above calculation, and C is added to Bn which is a measured value of the arc width after that. In this way, the measured diameter Dn is obtained, and automatic control is conducted so that the measured diameter Dn can be a predetermined value.

The crystal bodies obtained by the pulling method of the present invention were compared with the crystal bodies obtained by the method of the prior art, wherein specific examples were used in the comparison.

Figure 4A:
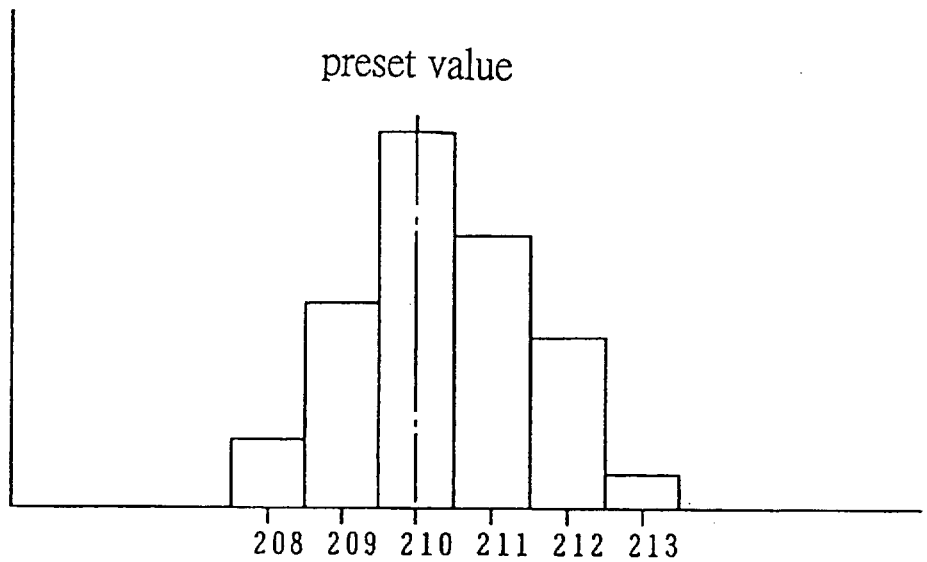
FIGS. 4a, 4b are graphs showing the distributions of the diameter values measured at various sites of the actual crystal bodies produced by the pulling up methods of this invention and prior art respectively.
Figure 4B:
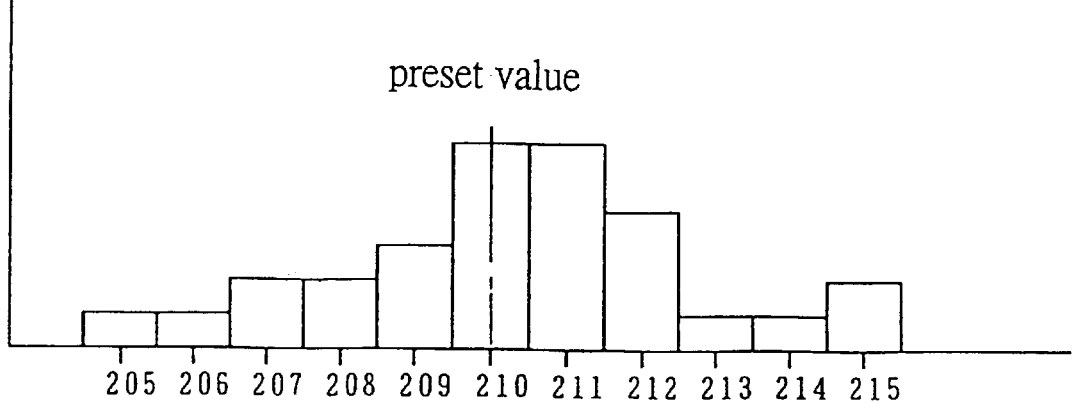

By the methods of the present invention and the prior art, about 30 pieces of crystal bodies, the target diameter of the straight body portion of which was 210 mm and the length of which was 1000 mm, were respectively pulled up. At a room temperature, the diameter was measured with vernier calipers at a plurality of positions. Then, an average diameter for each crystal body was calculated. The thus obtained average diameters are shown on the distribution diagram of FIG. 4. As shown in FIG. 4(a), according to the pulling method of the present invention, the distribution range was from +3 mm to −2 mm. As shown in FIG. 4(b), when the pulling method of the prior art was adopted and no operator conducted a correcting operation, the distribution range was increased to ±5 mm.

Since the present invention is composed as described above, the following effects can be provided. When the crystal bodies are pulled up, automatic diameter control is continuously conducted from the process of forming the shoulder to the process of forming the body, using the measured values of the bright ring width in the two windows. Since the target value of the diameter of the straight body portion is determined by the measured value of the largest width of the bright ring, the accuracy of controlling the diameter is much higher than that of the conventional method as shown in FIG. 4. It is not necessary for an operator to conduct correction, which contributes to the automatization of the process of pulling up the crystal bodies.

Even in the pulling device having a heat shielding plate, the measured values are not affected by a reflected image formed on the heat shielding plate, and the above characteristic can be exhibited.

What is claimed is:

1. A method of pulling up a single crystal semiconductor, comprising the steps of:

measuring a largest width of a bright ring and a width of an arc corresponding to an arbitrary portion of the bright ring located before the largest width portion in the process of forming a shoulder in which the single crystal diameter is gradually increased from a diameter of a neck portion to a required final diameter to remove dislocations while growing the single crystal; and conducting automatic control so that a measured value of the arc width can be close to a reference value, said reference value being based on the measured value of the arc width obtained when the largest width of the bright ring has reached the required final diameter.

2. A method of pulling up a single crystal semiconductor, comprising the steps of:

obtaining an actual diameter by measuring a largest width of a bright ring in the process of automatic control in which a target value of the diameter is gradually increased in the process of forming the shoulder and the actual diameter is made to follow the target value; and obtaining the actual diameter by measuring the arc width when the diameter is automatically controlled to be a required final value after the diameter has reached the required final value.

3. A method of pulling up a single crystal semiconductor according to claim 2, further comprising the steps of:

subtracting the measured arc width from the largest width of the bright ring obtained when the diameter has reached the required final value in the process of forming the shoulder; and adding this difference to the measured value of the arc width as a constant, wherein the added value is used as a measured value of the diameter.

4. A method of pulling up a single crystal semiconductor, comprising the steps of:

photographing the melt and the crystal body, which is being pulled up from the melt, with a camera, the camera having a field of view in which the largest width portion of a bright ring generated in the boundary between the melt and the crystal body, and an arc of the bright ring located before the largest width portion are simultaneously accommodated; and providing a first window for covering the largest width portion on an image of the camera and also providing a second window for-covering the portion located before the largest width portion on an image of the camera; and measuring the maximum value of the bright ring width in each window.

* * * * *